United States Patent
Gao

(10) Patent No.: US 11,457,547 B1
(45) Date of Patent: Sep. 27, 2022

(54) PHASE CHANGE THERMAL MANAGEMENT SYSTEM FOR ELECTRONIC RACKS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 17/325,732

(22) Filed: May 20, 2021

(51) Int. Cl.
  *G06F 1/16* (2006.01)
  *H05K 5/00* (2006.01)
  *H05K 7/00* (2006.01)
  *H05K 7/20* (2006.01)

(52) U.S. Cl.
  CPC ......... *H05K 7/20836* (2013.01); *H05K 7/208* (2013.01)

(58) Field of Classification Search
  CPC ............. H05K 7/20836; H05K 7/208; H05K 7/20809; H05K 7/20818; H05K 7/20827; G06F 1/20; G06F 1/203; G06F 1/206
  See application file for complete search history.

(56) References Cited

U.S. PATENT DOCUMENTS

| | | | | |
|---|---|---|---|---|
| 10,888,024 | B1* | 1/2021 | Pichai | H05K 7/20827 |
| 2012/0120603 | A1* | 5/2012 | Campbell | G06F 1/20 361/698 |
| 2013/0098085 | A1* | 4/2013 | Judge | F25B 41/00 62/190 |
| 2013/0105139 | A1* | 5/2013 | Campbell | H05K 7/20836 165/300 |
| 2014/0326016 | A1* | 11/2014 | Shoujiguchi | H05K 7/20309 62/428 |
| 2021/0204451 | A1* | 7/2021 | Keehn | H05K 7/20809 |
| 2022/0087076 | A1* | 3/2022 | Malouin | H05K 7/20836 |

* cited by examiner

*Primary Examiner* — Anthony M Haughton
(74) *Attorney, Agent, or Firm* — Womble Bond Dickinson (US) LLP

(57) ABSTRACT

A thermal management system includes an auxiliary thermal management unit, the auxiliary thermal management unit includes a vapor inlet line, a liquid outlet line, and a phase change unit. The phase change unit includes a condenser and a compressor. The auxiliary thermal management unit includes a vapor buffer unit coupled between the vapor inlet line and the phase change unit. The auxiliary thermal management unit includes a liquid buffer unit coupled between the liquid outlet line and the phase change unit, where the auxiliary thermal management unit is to form a double-buffered vapor-liquid loop between the vapor inlet line and the liquid outlet line, where the vapor inlet line is coupled to a rack vapor return of an electronic rack to receive vapor and the liquid outlet line is coupled to a rack liquid supply of the electronic rack to supply cooling liquid.

20 Claims, 7 Drawing Sheets

PHASE CHANGE THERMAL MANAGEMENT SYSTEM FOR ELECTRONIC RACKS

FIELD OF THE INVENTION

Embodiments of the present invention relate generally to server and data center cooling. More particularly, embodiments of the invention relate to a phase change thermal management system for electronic racks.

BACKGROUND

Modern information technology (IT) equipment such as servers, blade servers, routers, edge servers, etc., generates a substantial amount of heat during operation. The heat generated by individual components, especially high-power components such as processors, makes many of these individual components impossible or difficult to cool effectively with air cooling systems. Modern IT equipment therefore requires liquid cooling or liquid-air hybrid cooling.

There are several thermal management challenges with existing data centers/electronic racks for server and IT equipment populations, deployment, and/or operations. These challenges include high power density, variations in thermal loads at different electronic racks, variations in thermal loads at different time periods of the day, support for dual phase thermal management technologies.

Conventional solutions do not handle mismatches of the cooling capacity and heat load, which means the thermal system design is not power and cost effective.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
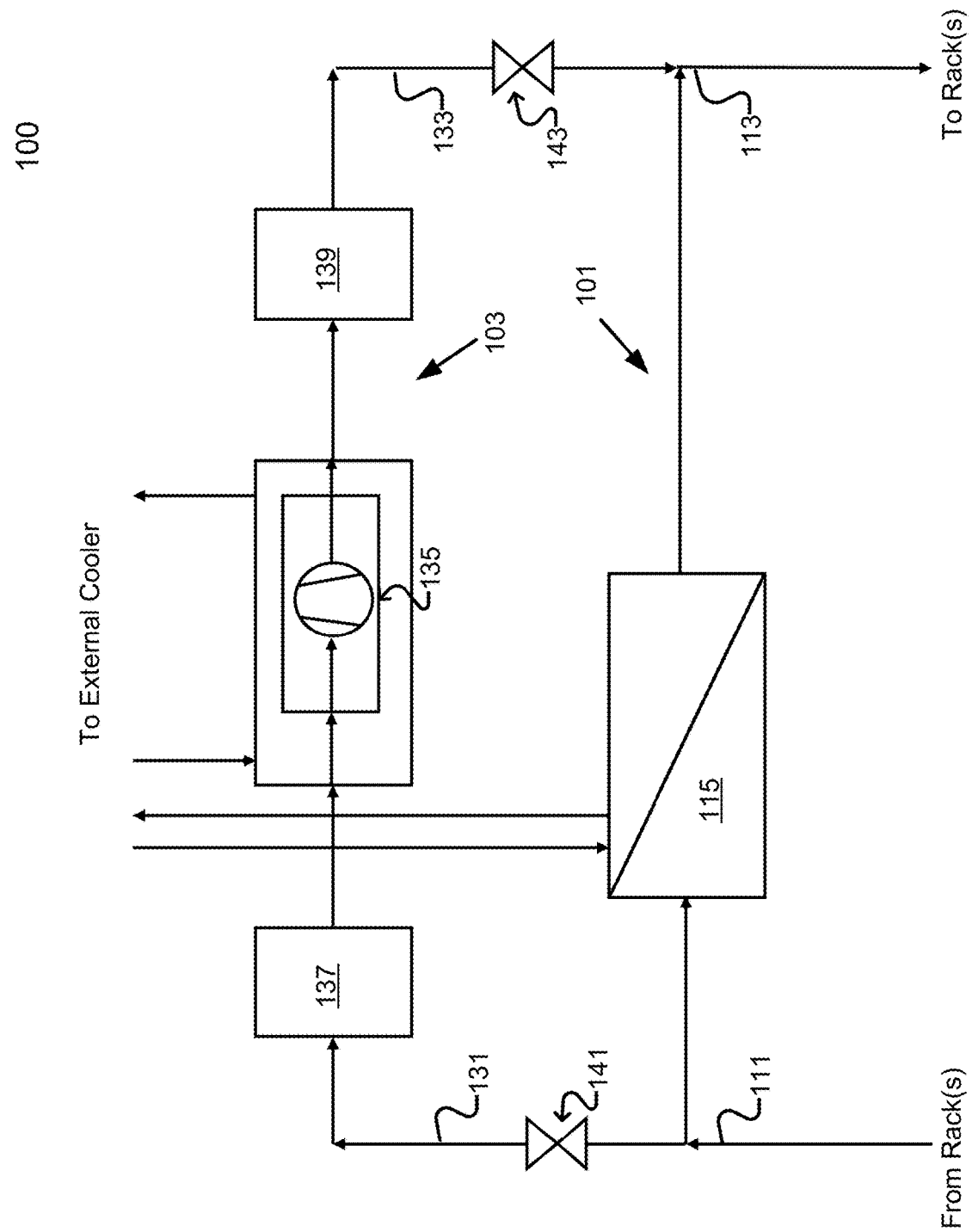
FIG. 1 is a block diagram of a phase change thermal management system with a main system and an auxiliary system according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Aspects of the present disclosure are directed to a phase change thermal management system architecture. The thermal management system architecture includes a main cooling system which includes a vapor return line, a liquid supply line, and a condenser. The vapor line and the liquid line are extended to an auxiliary cooling system that is in parallel with the main cooling system. The auxiliary cooling system can include a vapor container, a compression/condenser unit, and a liquid container. In this design, the vapor container, the liquid container, and the compressor/condenser can be operated asynchronously. The vapor container and the liquid container can include pressure sensor and liquid level sensor, respectively, to control the operation of the condenser/compressor. The condenser/compressor can be powered by a renewable power source such as solar power.

According to a first aspect, a thermal management system includes an auxiliary thermal management unit, the auxiliary thermal management unit includes a vapor inlet line, a liquid outlet line, and a phase change unit. The phase change unit includes a condenser and a compressor. The auxiliary thermal management unit includes a vapor buffer unit coupled between the vapor inlet line and the phase change unit. The auxiliary thermal management unit includes a liquid buffer unit coupled between the liquid outlet line and the phase change unit, where the auxiliary thermal management unit is to form a double-buffered vapor-liquid loop between the vapor inlet line and the liquid outlet line, where the vapor inlet line is coupled to a rack vapor return of an electronic rack to receive vapor and the liquid outlet line is coupled to a rack liquid supply of the electronic rack to supply cooling liquid.

In one embodiment, the thermal management system further includes a main thermal management unit, where the vapor inlet line is coupled to a vapor line of the main thermal management unit and the rack vapor return of an electronic rack, where the liquid outlet line is coupled to a liquid line of the main thermal management unit and the rack liquid supply of the electronic rack, where the main thermal management unit is configured to operate continuously to remove a thermal load from the electronic rack.

In one embodiment, the auxiliary thermal management unit is configured to operate on a scheduled basis to remove a thermal load from the electronic rack. In one embodiment, the auxiliary thermal management unit is configured to operate based on a model that optimizes energy efficiency, where the model is fitted to historical operating data to minimize the energy consumption by auxiliary thermal management unit.

In one embodiment, the thermal management system further includes a vapor line valve coupled to the vapor inlet line, and a liquid line valve coupled to the liquid outlet line, where the vapor line valve and the liquid line valve are controlled by a controller of the electronic rack. In one embodiment, the vapor line valve is caused to be automatically triggered by vapor pressure at the vapor line valve.

In one embodiment, the thermal management system further includes a vapor container having a constant volume, and a pressure sensor configured to sense a pressure for vapor stored in the vapor container.

In one embodiment, the thermal management system further includes a liquid container, and a liquid level sensor configured to sense a liquid level for liquid stored in the liquid container.

In one embodiment, the thermal management system further includes a photovoltaic power source, a power storage system, and a controller coupled to the photovoltaic power source and the power storage system, where the controller is configured to cause the phase change unit to operate at a predetermined time of day.

In one embodiment, the vapor buffer unit, the liquid buffer unit, and the phase change unit are operated asynchronously.

In one embodiment, the sensors of the vapor buffer unit and/or liquid buffer unit may initiate the phase change unit to function/operate.

According to a second aspect, a data center includes an electronic rack, the electronic rack includes a rack manifold having a rack liquid supply to receive first cooling liquid from a cooling source and a rack vapor return to return vapor to the cooling source. The electronic rack includes a number of server chassis arranged in a stack, each server chassis including one or more cold plates associated with one or more information technology (IT) components. The data center includes a thermal management system having an auxiliary thermal management unit, where the auxiliary thermal management unit includes a vapor inlet line, a liquid outlet line, and a phase change unit. The phase change unit includes a condenser and a compressor. The auxiliary thermal management unit includes a vapor buffer unit coupled between the vapor inlet line and the phase change unit. The auxiliary thermal management unit includes a liquid buffer unit coupled between the liquid outlet line and the phase change unit, where the auxiliary thermal management unit is to form a double-buffered vapor-liquid loop between the vapor inlet line and the liquid outlet line, where the vapor inlet line is coupled to the rack vapor return of the electronic rack to receive vapor and the liquid outlet line is coupled to the rack liquid supply of the electronic rack to supply cooling liquid.

In one embodiment, the thermal management system includes a number of liquid outlet valves and a vapor inlet valve, where each of the liquid outlet valves is coupled to a rack liquid supply return corresponding to at least one of a number of electronic racks, where the vapor inlet valve is coupled to a rack vapor return that is combined from each of the electronic racks.

In one embodiment, the thermal management system includes a number of liquid outlet valves and a number of vapor inlet valves, where each of the liquid outlet valves is coupled to a rack liquid supply return corresponding to at least one of a number of electronic racks, where each of the vapor inlet valves is coupled to a rack vapor return corresponding to at least one of the electronic racks.

According to a third aspect, a data center includes a number of electronic racks, each of the electronic racks includes a rack manifold having a rack liquid supply to receive first cooling liquid from a cooling source and a rack vapor return to return vapor to the cooling source and a number of server chassis arranged in a stack, each server chassis including one or more cold plates associated with one or more information technology (IT) components. The data center includes a number of main thermal management units, wherein each of the main thermal management units is coupled to at least one of the electronic racks. The data center includes a thermal management system having an auxiliary thermal management unit. The auxiliary thermal management unit includes a vapor inlet line, liquid outlet line, a phase change unit, and a vapor buffer unit coupled between the vapor inlet line and the phase change unit. The auxiliary thermal management unit includes a liquid buffer unit coupled between the liquid outlet line and the phase change unit, where the auxiliary thermal management unit is to form a double-buffered vapor-liquid loop between the vapor inlet line and the liquid outlet line, where the vapor inlet line is coupled to a vapor line of a main thermal management unit and the rack vapor return of an electronic rack, where the liquid outlet line is coupled to a liquid line of the main thermal management unit and the rack liquid supply of the electronic rack.

FIG. 1 is a block diagram of a phase change thermal management system 100 with a main cooling system 101 and an auxiliary cooling system 103 according to one embodiment. Main cooling system 101 includes vapor return line 111, liquid supply line 113, and condenser 115. Condenser 115 operates as a cooling unit to condense a circulating cooling medium from a vapor state to a liquid state.

Auxiliary cooling system 103 includes components such as: a vapor line 131, a vapor container 137, a phase change unit 135 (e.g., condenser/compressor unit), liquid container 139, and a liquid line 133. Vapor line 131 is coupled to vapor line 111 through a vapor line valve 141. Vapor line valve 141 can be in an open position when a vapor pressure is above a threshold, and a closed position when a vapor pressure is below the threshold. Which can mean that vapor would stays within main cooling system 101 and cooled by condenser 115, during normal operation. Vapor would enter auxiliary cooling system 103 and is cooled by condenser/compressor unit 135 during extended operation.

Vapor container 137 can be used as a buffer to accumulate vapor of a cooling medium at vapor line 131. But vapor container 137 may not directly release the vapor from vapor container 137 to condenser/compressor unit 135 since condenser/compressor unit 135 may not be in active operation. In one embodiment, vapor container 137 releases vapor to condenser unit 135 with compressor unit being inactive, e.g., with only condenser being active.

Condenser/compressor unit 135 is used for condensing a vapor to liquid either with or without the vapor being compressed. The input vapor flows from vapor container 137 and the output liquid is stored at liquid container 139.

Liquid container 139 can be used as a buffer to contain a liquid flowing from condenser/compressor unit 135. Liquid container 139 directs the liquid out to liquid line 133 if liquid line valve 143 is open. Otherwise, liquid is stored at liquid container 139. Liquid container 139, condenser/compressor unit 135, and vapor container 137 can operate asynchronously.

Liquid line 133 is coupled to liquid line 113 through liquid line valve 143. Liquid line valve 143 can be in an open position when a liquid level in liquid container 139 is above a threshold, and a closed position when the liquid level in liquid container 139 is below the threshold. Overall, system 100 includes a fully active natural convection phase change system and a highly controllable vapor compression system, where components of auxiliary cooling system 103 can be operated in an asynchronous manner.

Figure 2:
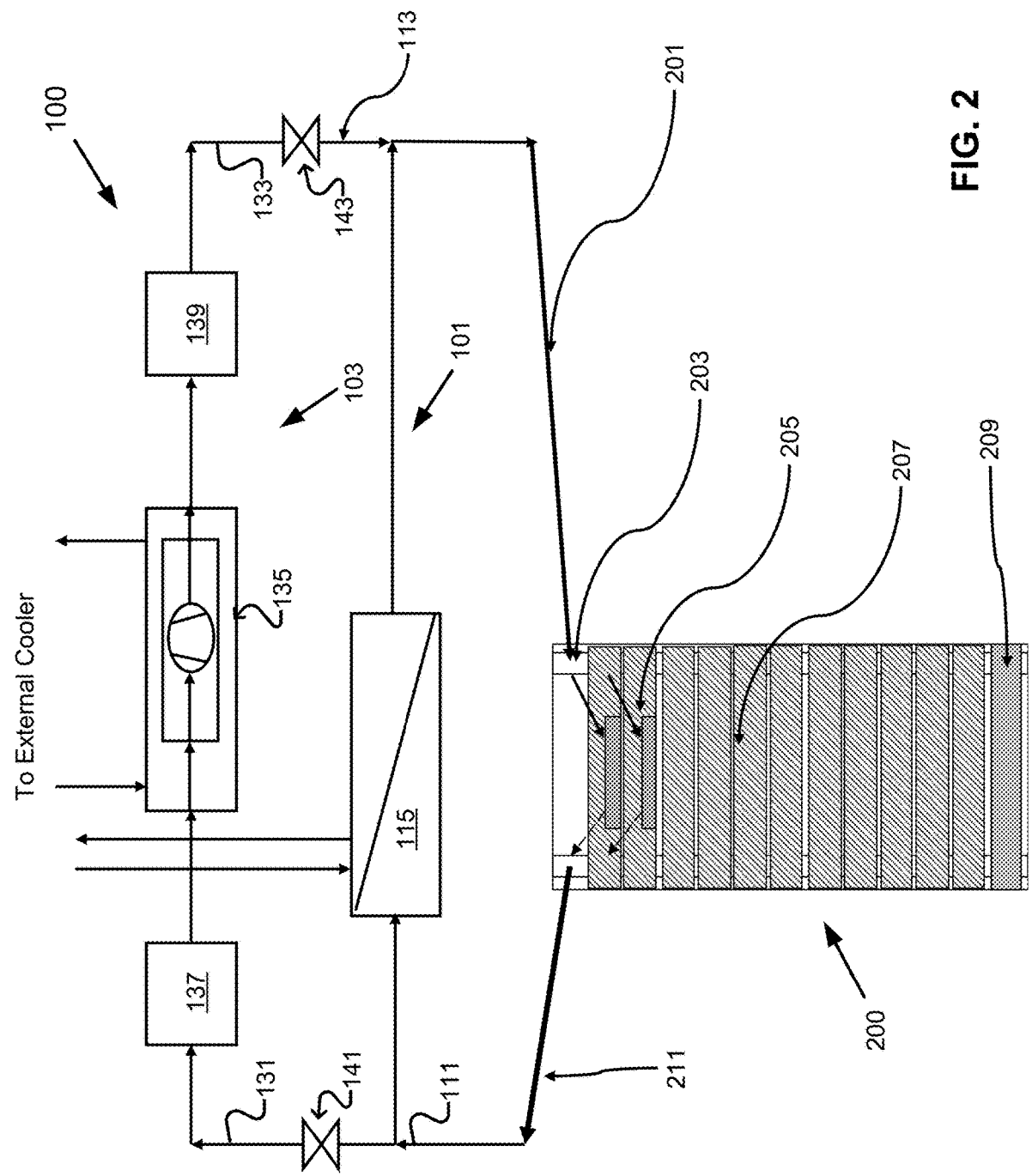
FIG. 2 is a block diagram of a phase change thermal management system integrated to an electronic rack according to one embodiment.

FIG. 2 is a block diagram of a phase change thermal management system 100 integrated to an electronic rack 200 according to one embodiment. As shown, electronic rack 200 is connected to thermal management system 100 through vapor line 111 and liquid line 113.

Electronic rack 200 can include liquid supply 201, rack distribution 203, cooling devices 205, servers 207, rack management controller 209, and vapor return 211, where vapor return 211 is coupled to vapor line 111 and liquid supply 201 is coupled to liquid line 113. Liquid supply 201 can receive a liquid cooling medium from thermal management system 100. The liquid cooling medium can be circulated at electronic rack 200 by natural convection (passively) or assisted convection (active pump and fan). E.g., a cooling liquid falls down from liquid supply 201 to servers 207 to cool servers 207. The cooling liquid in removing a thermal load from servers 207 is induced to change phases to a vapor state, where the vapor rises through vapor return 211.

In one embodiment, rack distribution 203 can distribution liquid cooling medium to individual cooling devices 205 by natural convection or assisted convection, where individual cooling devices 205 are coupled to informational technology (IT) components of servers 207. Rack management controller 209 can manage thermal cooling for electronic rack 200. For example, rack management controller 209 can control rack distribution 203 to distribute liquid to individual cooling devices 205. In one embodiment, rack management controller 209 can control vapor valve 141 and liquid valve 143 based on a current power consumed by electronic rack 200 or a history power consumption of electronic rack 200. For example, if the power consumption is above a threshold, rack management controller 209 can switch open vapor valve 141 and/or liquid valve 143. Although one electronic rack 200 is shown, thermal management system 100 can be connected to any number of electronic racks.

Servers 207 can include one or more IT components (e.g., central processing units or CPUs, general/graphic processing units (GPUs), memory, and/or storage devices). Each IT component may perform data processing tasks, where the IT component may include software installed in a storage device, loaded into the memory, and executed by one or more processors to perform the data processing tasks.

Servers 207 can be host servers or compute servers. A host server typically interfaces with clients over a network (e.g., Internet) to receive a request for a particular service such as storage services (e.g., cloud-based storage services such as backup and/or restoration), or services to execute an application to perform certain operations (e.g., image processing, deep data learning algorithms or modeling, etc., as a part of a software-as-a-service or SaaS platform). In response to the request, the host server distributes the tasks to compute server(s) (having one or more GPUs) managed by the host server. The host server or compute servers perform particular tasks, which generates heat during these operations.

Figure 3:
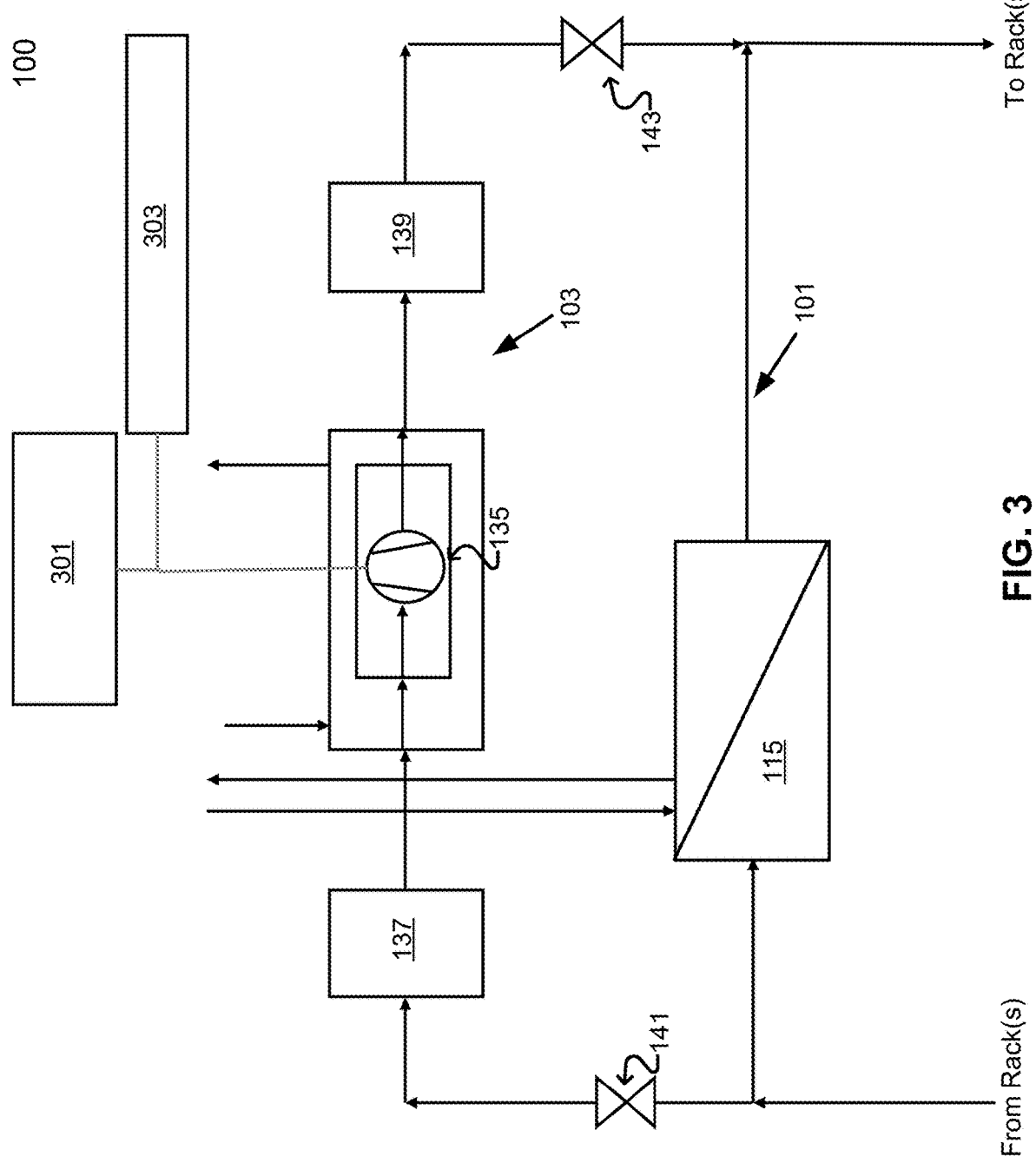
FIG. 3 is a block diagram of a phase change thermal management system co-designed with a power system according to one embodiment.

FIG. 3 is a block diagram of a phase change thermal management system co-designed with a power system according to one embodiment. In this example, auxiliary cooling system 103 is powered by a photovoltaic source 301. In one embodiment, condenser/compressor unit 135 can be powered by photovoltaic source 301. In one embodiment, an energy storage unit 303 is used to buffer the energy storage. Since the condenser unit 135 may not be operating efficiently when solar source 301 is providing energy, and compressor unit 135 is operated based on a rack controller, or a condition of vapor container, and/or a condition of liquid container, the energy storage unit 303 can buffer the collected solar energy and power the condenser/compressor unit 135 when condenser/compressor unit 135 operates most efficiently. In one embodiment, energy storage unit 303 collects energy during the day when sunny and supplies energy to power condenser/compressor unit 135 at night when the outdoor air is typically coolest to achieve highest efficiency for condenser unit 135.

In this case, vapor container 137, condenser/compressor unit 135, power storage system 303, together enable a flexible cooling system. For example, vapor container 137 can collect vapor, while compressor unit 135 may be idle. This means that a heat load can be stored at vapor container 137. Liquid container 139 can be used to continuously supply a reserve liquid even with intermittent liquid supplying from condenser unit 135, delivering a buffered cooling capacity. Additionally, power collected from photovoltaic source 301, together with energy storage 303, can be used by condenser unit 135 to condense vapor at vapor container 137 to a liquid and store the liquid at liquid container 139 at any time. Although a solar power source is shown, source 301 can be any type of power source, e.g., hydro, wind, nuclear, etc.

Figure 4:
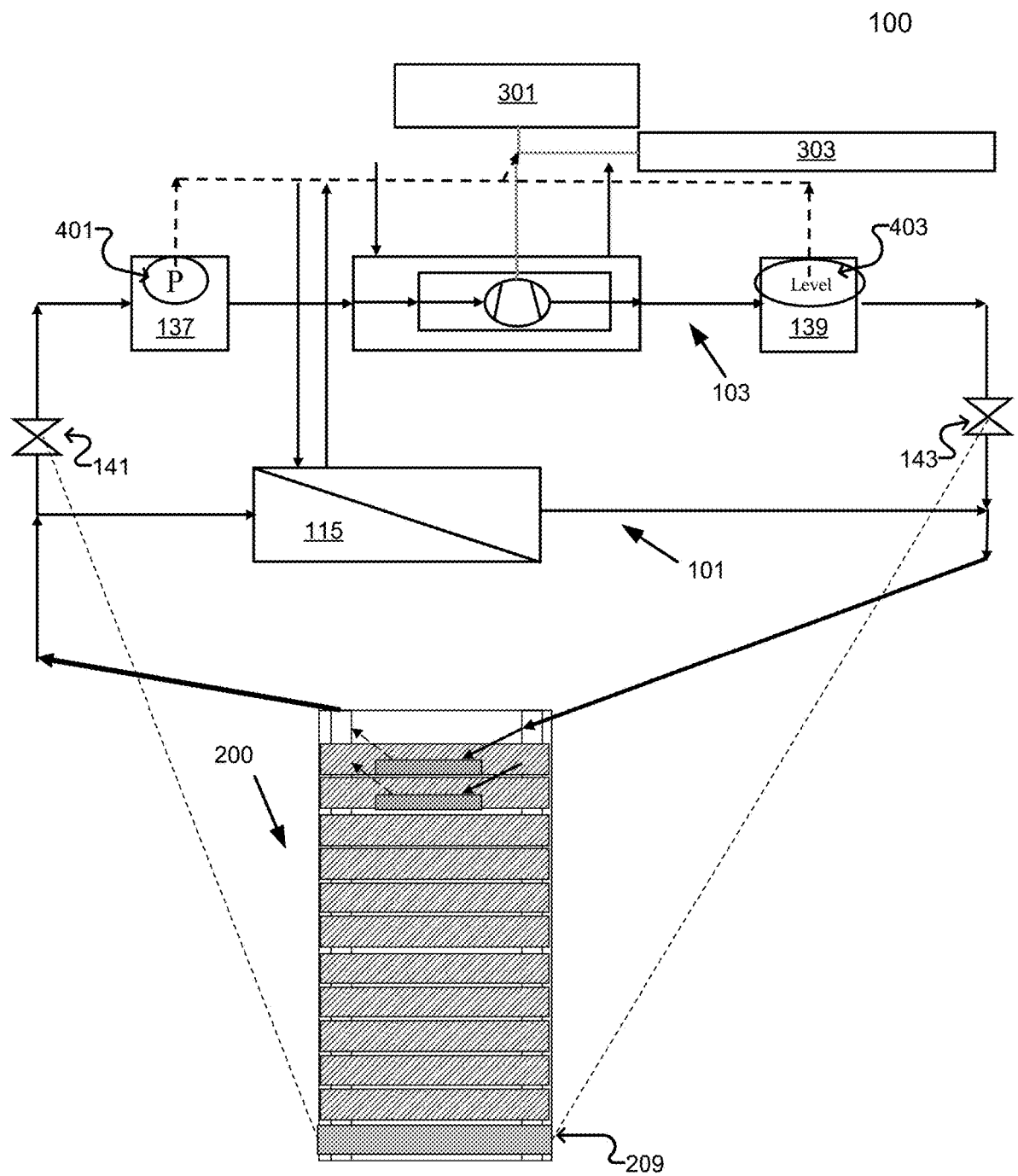
FIG. 4 is a block diagram of a phase change thermal management system co-designed with a power system integrated to an electronic rack according to one embodiment.

FIG. 4 is a block diagram of a phase change thermal management system co-designed with a power system integrated to an electronic rack according to one embodiment.

As shown, a pressure sensor 401 in vapor container 137 and a liquid level sensor 403 in liquid container 139 are used for controlling a power delivered to condenser/compressor unit 135. For example, when pressure sensor 401 senses that a pressure of vapor container 137 is above a threshold, pressure sensor 401 can trigger power delivery to condenser/compressor unit 135 so compressor 135 can start compressing vapor from vapor container 137. When level sensor 403 senses that a liquid level of liquid container 139 is below a minimum threshold, level sensor 403 can switch on power delivery to condenser/compressor unit 135 to active condenser 135. When level sensor 403 senses that a liquid level of liquid container 139 is above a maximum threshold, level sensor 403 can switch off power delivery to condenser/compressor unit 135 to inactive condenser 135.

On electronic rack 200, controller 209 can control vapor line valve 141 and liquid line valve 143, independently. For example, if controller 209 detects temperature of a server on electronic rack 200 is above a temperature threshold and/or a power usage is above a power threshold, controller 209 can switch on vapor line valve 141 and/or liquid line valve 143 to activate additional cooling capacity provided by auxiliary cooling system 103.

Figure 5:
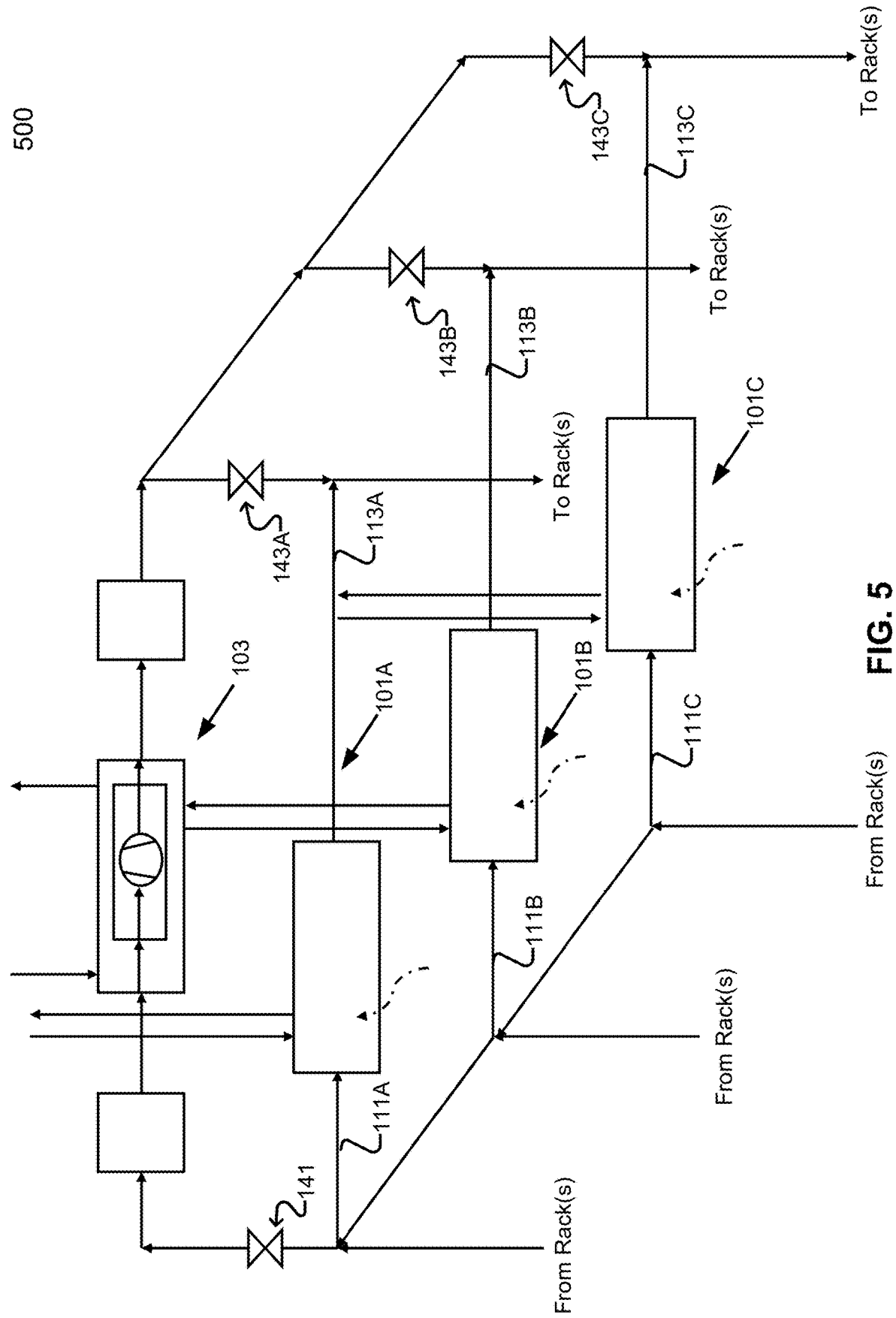
FIG. 5 is a block diagram of a cluster architecture for a phase change thermal management system according to one embodiment.

FIG. 5 is a block diagram of a cluster architecture 500 for a phase change thermal management system according to one embodiment. Cluster architecture 500 can represent system 100 of FIGS. 1-4. As shown, cluster architecture 500 includes three individual main cooling systems 101A-C. Each of individual main cooling systems 101A-C can be used for one or more electronic racks (not shown). E.g., auxiliary cooling system 103 is shared among a cluster of electronic racks. In this design, vapor return valve 141 is shared by vapor lines 111A-111C. Liquid supply valve 143A-C are independently controlled, where each of liquid supply valve 143A-C is coupled to a corresponding liquid line 113A-C.

Figure 6:
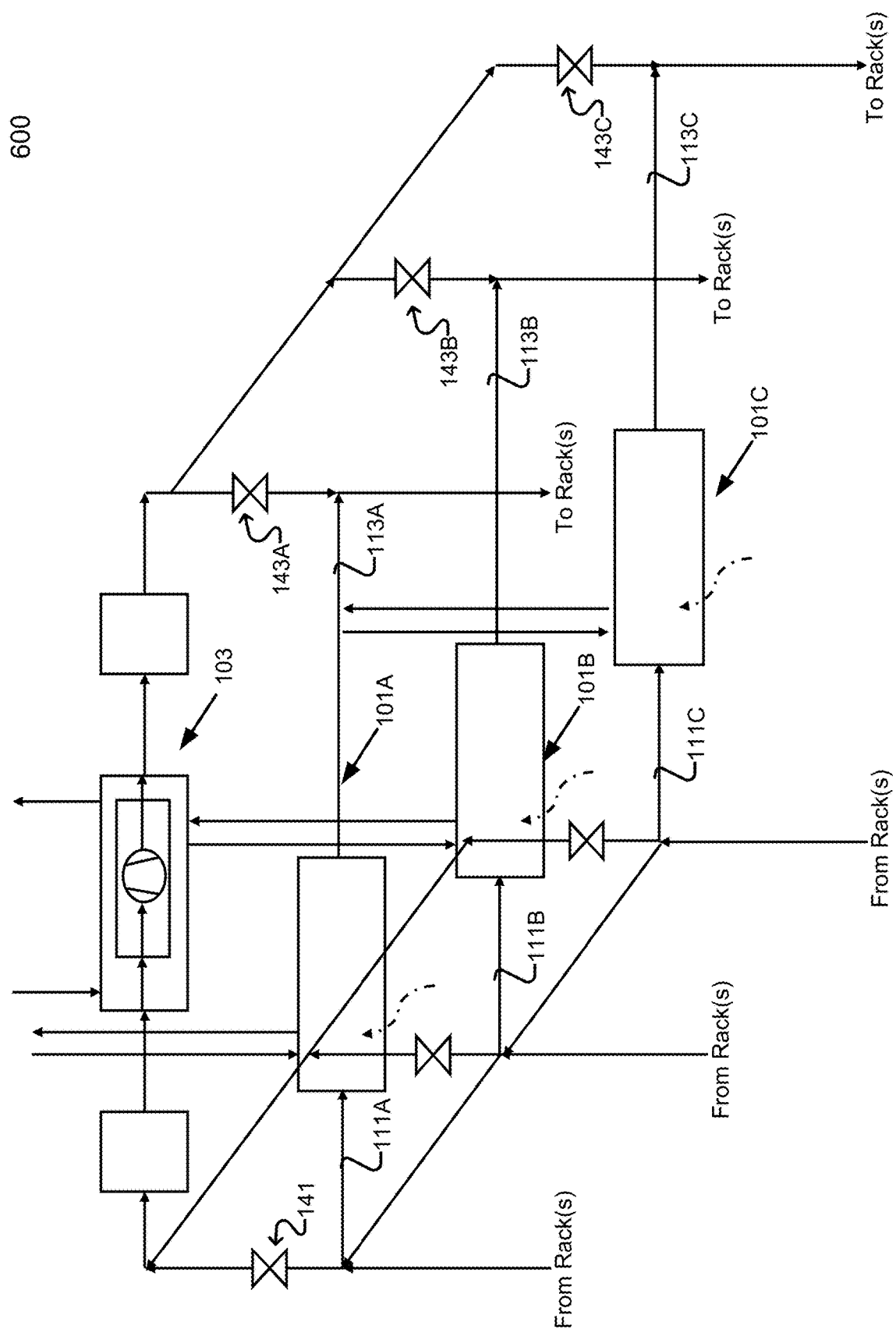
FIG. 6 is a block diagram of a cluster architecture for a phase change thermal management system with separate vapor return line valves according to one embodiment.

FIG. 6 is a block diagram of a cluster architecture 600 for a phase change thermal management system with separate vapor return line valves according to one embodiment.

Cluster architecture 600 can represent system 100 of FIGS. 1-4. As shown, cluster architecture 600 includes three individual main cooling systems 101A-C. Each of individual main cooling systems 101A-C can be used for one or more electronic racks (not shown). E.g., auxiliary cooling system 103 is shared among a cluster of electronic racks. In this design, vapor return valves 141A-C are independently controlled, where each of vapor return valves 141A-C is coupled to a corresponding vapor line 111A-C. In this case, one or more rack(s) can individually be controlled to connect to auxiliary cooling system 103. Liquid supply valve 143A-C are also independently controlled, where each of liquid supply valve 143A-C is coupled to a corresponding liquid line 113A-C. Overall, auxiliary cooling system 103 is connected separated for separate vapor lines 111A-C for electronics rack(s). A controller (such as controller 209 of FIG. 2) can control a respective vapor valve 141A-C for individual rack based on a predetermined thermal and/or power operation conditions. The thermal and/or power operation conditions can be a server operating above a temperature threshold and/or a power consumption of a server or the rack is above a predetermined power threshold. Although three main cooling systems 101A-C are shown in FIGS. 5-6, auxiliary cooling system 103 can be coupled to any number of main cooling systems.

Figure 7:
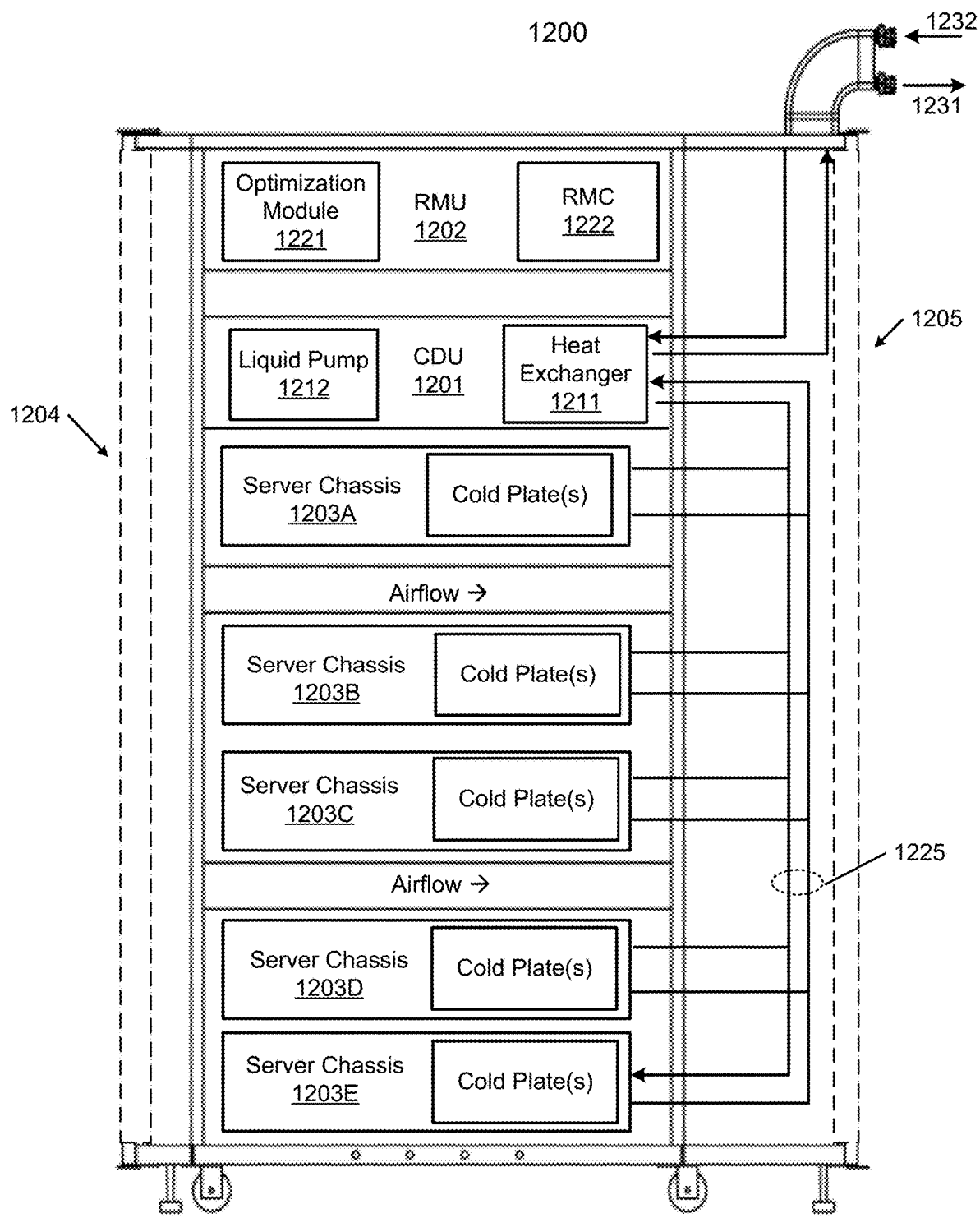
FIG. 7 is block diagram illustrating an electronic rack according to one embodiment.

FIG. 7 is block diagram illustrating an electronic rack according to one embodiment. Electronic rack 1200 may represent any of the electronic racks as described throughout this application. According to one embodiment, electronic rack 1200 includes, but is not limited to, coolant distribution unit (CDU) 1201, rack management unit (RMU) 1202, and one or more server chassis 1203A-1203E (collectively referred to as server chassis 1203). Server chassis 1203 can be inserted into an array of server slots (e.g., standard shelves) respectively from frontend 1204 or backend 1205 of electronic rack 1200. Note that although there are five server chassis 1203A-1203E shown here, more or fewer server chassis may be maintained within electronic rack 1200. Also note that the particular positions of CDU 1201, RMU 1202, and/or server chassis 1203 are shown for the purpose of illustration only; other arrangements or configurations of CDU 1201, RMU 1202, and/or server chassis 1203 may also be implemented. In one embodiment, electronic rack 1200 can be either open to the environment or partially contained by a rack container, as long as the cooling fans can generate airflows from the frontend to the backend.

In addition, for at least some of the server chassis 1203, an optional fan module (not shown) is associated with the server chassis. Each of the fan modules includes one or more cooling fans. The fan modules may be mounted on the backends of server chassis 1203 or on the electronic rack to generate airflows flowing from frontend 1204, traveling through the air space of the sever chassis 1203, and existing at backend 1205 of electronic rack 1200.

In one embodiment, CDU 1201 mainly includes heat exchanger 1211, liquid pump 1212, and a pump controller (not shown), and some other components such as a liquid reservoir, a vapor reservoir, a power supply, monitoring sensors and so on. Heat exchanger 1211 may be a vapor-to-liquid heat exchanger. Heat exchanger 1211 can include a first loop with inlet and outlet ports having a liquid connector and a vapor connector, respectively. The connectors coupled to the external vapor/liquid supply/return lines 1231-1232 may be disposed or mounted on backend 1205 of electronic rack 1200. The vapor/liquid supply/return lines 1231-1232, also referred to as room vapor/liquid supply/return lines, may be coupled to a phase change thermal management system (such as system 100 of FIG. 1-4), which may be coupled to an external cooling environment.

In one embodiment, heat exchanger 1211 further includes a second loop with two ports having a second pair of vapor/liquid connectors coupled to liquid manifold 1225 (also referred to as a rack manifold) to form a secondary loop, which may include a supply manifold (also referred to as a rack liquid supply line or rack supply manifold) to supply cooling liquid to server chassis 1203 and a return manifold (also referred to as a rack vapor return line or rack return manifold) to return vapor back to CDU 1201. Note that CDUs 1201 can be any kind of CDUs commercially available or customized ones. Thus, the details of CDUs 1201 will not be described herein.

Each of server chassis 1203 may include one or more IT components (e.g., central processing units or CPUs, general/graphic processing units (GPUs), memory, and/or storage devices). Each IT component may perform data processing tasks, where the IT component may include software installed in a storage device, loaded into the memory, and executed by one or more processors to perform the data processing tasks. Server chassis 1203 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more GPUs) managed by the host server. The compute servers perform the actual tasks, which may generate heat during the operations.

Electronic rack 1200 further includes optional RMU 1202 configured to provide and manage power supplied to servers 1203, and CDU 1201. RMU 1202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.,) to provide power to the rest of the components of electronic rack 1200.

In one embodiment, RMU 1202 includes optimization module 1221 and rack management controller (RMC) 1222. RMC 1222 can represent rack management controller 209 of FIGS. 2 and 4. RMC 1222 may include a monitor to monitor operating status of various components within electronic rack 1200, such as, for example, computing nodes 1203, CDU 1201, and the fan modules. Specifically, the monitor receives operating data from various sensors representing the operating environments of electronic rack 1200. For example, the monitor may receive operating data representing temperatures of the processors, cooling liquid, and airflows, which may be captured and collected via various temperature sensors. The monitor may also receive data representing the fan power and pump power generated by the fan modules and liquid pump 1212, which may be proportional to their respective speeds. These operating data are referred to as real-time operating data. Note that the monitor may be implemented as a separate module within RMU 1202.

Based on the operating data, optimization module 1221 performs an optimization using a predetermined optimization function or optimization model to derive a set of optimal fan speeds for the fan modules and an optimal pump speed for liquid pump 1212, such that the total power consumption of liquid pump 1212 and the fan modules reaches minimum, while the operating data associated with liquid pump 1212 and cooling fans of the fan modules are within their respective designed specifications. Once the optimal pump speed and optimal fan speeds have been determined, RMC 1222 configures liquid pump 1212 and cooling fans of the fan modules based on the optimal pump speeds and fan speeds.

As an example, based on the optimal pump speed, RMC 1222 communicates with a pump controller of CDU 1201 to control the speed of liquid pump 1212, which in turn controls a liquid flow rate of cooling liquid supplied to the liquid manifold 1225 to be distributed to at least some of server chassis 1203. Similarly, based on the optimal fan speeds, RMC 1222 communicates with each of the fan modules to control the speed of each cooling fan of the fan modules, which in turn control the airflow rates of the fan modules. Note that each of fan modules may be individually controlled with its specific optimal fan speed, and different fan modules and/or different cooling fans within the same fan module may have different optimal fan speeds.

In one embodiment, RMC 1222 communicates with vapor and liquid valves 141-143 of FIGS. 1-6 to control a flow for valves 141-143.

Note that the rack configuration as shown is described for the purpose of illustration only; other configurations or arrangements may also be applicable. For example, CDU 1201 may be an optional unit. The cold plates of server chassis 1203 may be coupled to a rack manifold, which may be directly coupled to room manifolds 1231-1232 without using a CDU. Although not shown, a power supply unit may be disposed within electronic rack 1200. The power supply unit may be implemented as a standard chassis identical or similar to a sever chassis, where the power supply chassis can be inserted into any of the standard shelves, replacing any of server chassis 1203. In addition, the power supply chassis may further include a battery backup unit (BBU) to provide battery power to server chassis 1203 when the main power is unavailable. The BBU may include one or more battery packages and each battery package include one or more battery cells, as well as the necessary charging and discharging circuits for charging and discharging the battery cells.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A thermal management system, comprising an auxiliary thermal management unit, the auxiliary thermal management unit comprising:
   a vapor inlet line;
   a liquid outlet line;
   a phase change unit, comprising a condenser and a compressor;
   a vapor buffer unit coupled between the vapor inlet line and the phase change unit; and
   a liquid buffer unit coupled between the liquid outlet line and the phase change unit, wherein the auxiliary thermal management unit is to form a double-buffered vapor-liquid loop between the vapor inlet line and the liquid outlet line, wherein the vapor inlet line is coupled to a rack vapor return of an electronic rack to receive vapor and the liquid outlet line is coupled to a rack liquid supply of the electronic rack to supply cooling liquid.

2. The thermal management system of claim 1, further comprising a main thermal management unit, wherein the vapor inlet line is coupled to a vapor line of the main thermal management unit and the rack vapor return of an electronic rack, wherein the liquid outlet line is coupled to a liquid line of the main thermal management unit and the rack liquid supply of the electronic rack, wherein the main thermal management unit is configured to operate continuously to remove a thermal load from the electronic rack.

3. The thermal management system of claim 1, wherein the auxiliary thermal management unit is configured to operate on a scheduled basis to remove a thermal load from the electronic rack.

4. The thermal management system of claim 1, further comprising:
   a vapor line valve coupled to the vapor inlet line; and
   a liquid line valve coupled to the liquid outlet line, wherein the vapor line valve and the liquid line valve are controlled by a controller of the electronic rack.

5. The thermal management system of claim 1, wherein the vapor buffer unit comprises:
   a vapor container having a constant volume; and
   a pressure sensor configured to sense a pressure for vapor stored in the vapor container.

6. The thermal management system of claim 1, wherein the liquid buffer unit comprises:
   a liquid container; and
   a liquid level sensor configured to sense a liquid level for liquid stored in the liquid container.

7. The thermal management system of claim 1, further comprising:
   a photovoltaic power source;
   a power storage system; and
   a controller coupled to the photovoltaic power source and the power storage system, wherein the controller is configured to cause the phase change unit to operate at a predetermined time of day.

8. The thermal management system of claim 1, wherein the vapor buffer unit, the liquid buffer unit, and the phase change unit are operated asynchronously.

9. A data center, comprising:
   an electronic rack, including:
      a rack manifold having a rack liquid supply to receive first cooling liquid from a cooling source and a rack vapor return to return vapor to the cooling source, and
      a plurality of server chassis arranged in a stack, each server chassis including one or more cold plates associated with one or more information technology (IT) components; and
   a thermal management system coupled to the electronic rack, the thermal management system having an auxiliary thermal management unit, wherein the auxiliary thermal management unit comprises:
      a vapor inlet line,
      a liquid outlet line,
      a phase change unit, comprising a condenser and a compressor,
      a vapor buffer unit coupled between the vapor inlet line and the phase change unit, and
      a liquid buffer unit coupled between the liquid outlet line and the phase change unit, wherein the auxiliary thermal management unit is to form a double-buffered vapor-liquid loop between the vapor inlet line and the liquid outlet line, wherein the vapor inlet line is coupled to the rack vapor return of the electronic rack to receive vapor, wherein the liquid outlet line is coupled to the rack liquid supply of the electronic rack to supply cooling liquid.

10. The data center of claim 9, further comprising a main thermal management unit, wherein the vapor inlet line is coupled to a vapor line of the main thermal management unit and the rack vapor return of the electronic rack, wherein the liquid outlet line is coupled to a liquid line of the main thermal management unit and the rack liquid supply of the electronic rack, wherein the main thermal management unit is configured to operate continuously to remove a thermal load from the electronic rack.

11. The data center of claim 9, wherein the auxiliary thermal management unit is configured to operate on a scheduled basis to remove a thermal load from the electronic rack.

12. The data center of claim 9, wherein the thermal management system further comprises:
a vapor line valve coupled to the vapor inlet line; and
a liquid line valve coupled to the liquid outlet line, wherein the vapor line valve and the liquid line valve are controlled by a controller of the electronic rack.

13. The data center of claim 9, wherein the vapor buffer unit comprises:
a vapor container having a constant volume; and
a pressure sensor configured to sense a pressure for vapor stored in the vapor container.

14. The data center of claim 9, wherein the liquid buffer unit comprises:
a liquid container; and
a liquid level sensor configured to sense a liquid level for liquid stored in the liquid container.

15. The data center of claim 9, further comprising:
a photovoltaic power source;
a power storage system; and
a controller coupled to the photovoltaic power source and the power storage system, wherein the controller is configured to cause the phase change unit to operate at a predetermined time of day.

16. The data center of claim 9, wherein the vapor buffer unit, the liquid buffer unit, and the phase change unit are operated asynchronously.

17. The data center of claim 9, further comprising a plurality of liquid outlet valves and a vapor inlet valve, wherein each of the plurality of liquid outlet valves is coupled to a rack liquid supply return corresponding to at least one of a plurality of electronic racks, wherein the vapor inlet valve is coupled to a rack vapor return that is combined from each of the plurality of electronic racks.

18. The data center of claim 9, further comprising a plurality of liquid outlet valves and a plurality of vapor inlet valves, wherein each of the plurality of liquid outlet valves is coupled to a rack liquid supply return corresponding to at least one of a plurality of electronic racks, wherein each of the plurality of vapor inlet valves is coupled to a rack vapor return corresponding to at least one of the plurality of electronic racks.

19. A data center, comprising:
a plurality of electronic racks, each of the plurality of electronic racks comprising:
a rack manifold having a rack liquid supply to receive first cooling liquid from a cooling source and a rack vapor return to return vapor to the cooling source, and
a plurality of server chassis arranged in a stack, each server chassis including one or more cold plates associated with one or more information technology (IT) components;
a plurality of main thermal management units, wherein each of the plurality of main thermal management units is coupled to one of the plurality of electronic racks; and
an auxiliary thermal management unit coupled to at least one of the electronic racks, wherein the auxiliary thermal management unit comprises:
a vapor inlet line,
a liquid outlet line,
a phase change unit, comprising a condenser and a compressor,
a vapor buffer unit coupled between the vapor inlet line and the phase change unit, and
a liquid buffer unit coupled between the liquid outlet line and the phase change unit, wherein the auxiliary thermal management unit is to form a double-buffered vapor-liquid loop between the vapor inlet line and the liquid outlet line, wherein the vapor inlet line is coupled to a vapor line of a main thermal management unit and the rack vapor return of the at least one electronic rack, wherein the liquid outlet line is coupled to a liquid line of the main thermal management unit and the rack liquid supply of the at least one electronic rack.

20. The data center of claim 19, wherein the auxiliary thermal management unit is configured to operate on a scheduled basis to remove a thermal load from the at least one electronic rack.

\* \* \* \* \*